United States Patent
Sidhwa (12)

(10) Patent No.: US 6,365,496 B1
(45) Date of Patent: Apr. 2, 2002

(54) ELIMINATION OF JUNCTION SPIKING USING SOFT SPUTTER ETCH AND TWO STEP TIN FILM DURING THE CONTACT BARRIER DEPOSITION PROCESS

(75) Inventor: Ardeshir J. Sidhwa, Scottsdale, AZ (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/714,698

(22) Filed: Nov. 16, 2000

(51) Int. Cl.[7] ........................................ H01L 21/3205
(52) U.S. Cl. ................. 438/586; 438/231; 438/232; 438/301; 438/303; 438/305; 438/585; 437/180; 437/187; 437/195; 437/228
(58) Field of Search ................ 438/586, 232, 438/585, 231, 301, 303, 305; 437/195, 228, 180, 187

(56) References Cited

U.S. PATENT DOCUMENTS 4,782,380 A * 11/1988 Shankar et al. ............ 357/71
4,784,973 A * 11/1988 Stevens et al. ............ 437/200
5,395,798 A * 3/1995 Havemann ................. 437/200
5,670,427 A * 9/1997 Cho ........................... 437/195
6,153,456 A * 11/2000 Lin et al. ................... 438/232

* cited by examiner

*Primary Examiner*—Richard Elms
*Assistant Examiner*—Pho Luu
(74) *Attorney, Agent, or Firm*—Lisa K. Jorgenson; Daniel E. Venglarik

(57) ABSTRACT

A contact opening to a silicon substrate within which a metal contact is to be formed is cleaned by soft sputter etch to clean the substrate surface and remove any residue which would interfere with formation of a continuous silicide layer across the contact region. Contact profile protrusion at the interface between two dielectrics forming the insulating material through which the contact opening is formed is also reduced by the soft sputter etch. A barrier is formed over the contact region utilizing two discrete deposition steps, preferably separated by an interval of time and employing different process parameters, to provide a shift in the grain boundaries between the two barrier layers, creating diffusion traps at grain discontinuities inhibiting the diffusion of metal through the barrier layer. Performance of the barrier layer in preventing junction spiking is thereby increased.

20 Claims, 2 Drawing Sheets

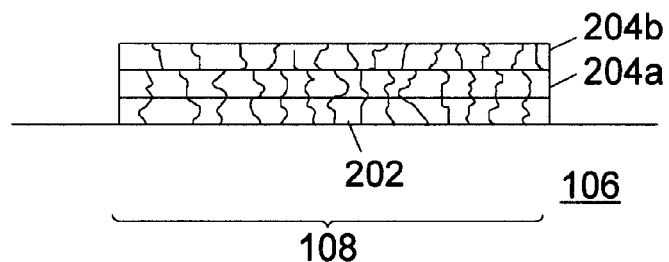
Figure 3A
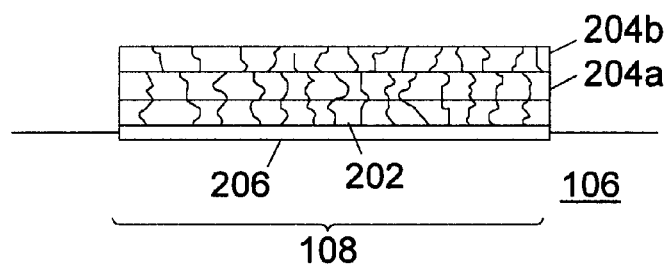
Figure 3B
Figure 3C
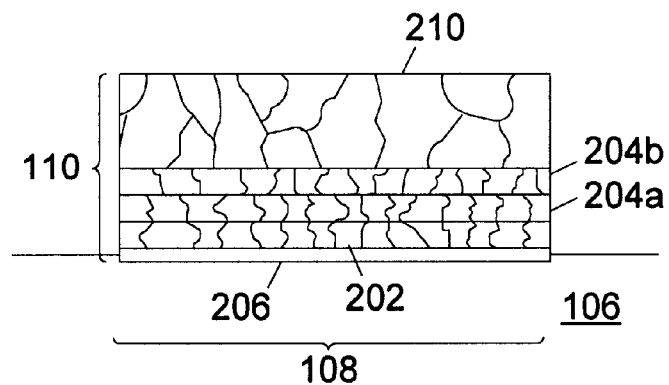
Figure 3D

ELIMINATION OF JUNCTION SPIKING USING SOFT SPUTTER ETCH AND TWO STEP TIN FILM DURING THE CONTACT BARRIER DEPOSITION PROCESS

BACKGROUND OF THE INVENTION

1. Field of the Invention

The present invention relates to semiconductor integrated circuit devices and in particular to formation of conductive contacts in semiconductor integrated circuit devices. Still more particularly, the present invention relates to formation of barrier layers employed between metal contacts and a silicon substrate.

2. Description of the Prior Art

Despite recent efforts to exploit metals such as copper or silver for microelectronic interconnects and contacts, aluminum (including aluminum alloy such as AlCu) contact technologies, which utilize only a titanium or titanium nitride barrier layer and an aluminum alloy metal contact or via, continue to be utilized for many different semiconductor device applications. Aluminum contact technologies are reliable, save costs, and eliminate the need for tungsten deposition and tungsten etch back or chemical mechanical polishing (CMP) processes normally associated with tungsten plug technology. Along with these advantages, however, there are disadvantages in using such aluminum contact technologies at the substrate contact metallization level.

The main disadvantage of using aluminum contact technologies at the substrate contact level is aluminum junction spiking, a result of aluminum spiking into the silicon substrate and silicon diffusion from the substrate into the contact plug. Such spiking may degrade the electrical characteristics of the contact, resulting, in turn, in improper operation of the circuit which includes the contact. Although sufficiently thick barrier layers may reduce the occurrence of such spiking, small geometry devices may not permit formation of layers of such thickness between the metal and the substrate.

It would be desirable, therefore, to provide a process for substantially reducing junction spiking for metal contacts utilized at the substrate contact level.

SUMMARY OF THE INVENTION

A contact opening to a silicon substrate within which a metal contact is to be formed is cleaned by soft sputter etch to clean the substrate surface and remove any residue which would interfere with formation of a continuous silicide layer across the contact region. Contact profile protrusion at the interface between two dielectrics forming the insulating material through which the contact opening is formed is also reduced by the soft sputter etch. A barrier is formed over the contact region utilizing two discrete deposition steps, preferably separated by an interval of time and employing different process parameters, to provide a shift in the grain boundaries between the two barrier layers, creating diffusion traps at grain discontinuities inhibiting the diffusion of metal through the barrier layer. Performance of the barrier layer in preventing junction spiking is thereby increased.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIGS. 3A–3D depict a series of cross-sectional views of the conductive layers employed in forming an aluminum contact to a silicon substrate in accordance with a preferred embodiment of the present invention.

DETAILED DESCRIPTION

The following description details the structure, application and features of the present invention, but it will be understood by those of skill in the art that the scope of the invention is defined only by the issued claims, and not by any description herein. The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures showing portions of an integrated circuit during fabrication are not necessarily drawn to scale, but instead are drawn so as to illustrate the important features of the invention.

Figure 1:
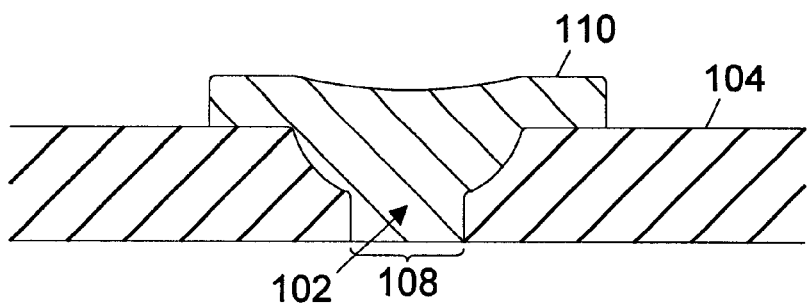
FIG. 1 depicts a cross-sectional view of a metal contact to a silicon substrate in accordance with a preferred embodiment of the present invention.

With reference now to the figures, and in particular with reference to FIG. 1, a cross-sectional view of a metal contact to a substrate in accordance with a preferred embodiment of the present invention is depicted. An opening 102 is formed through an insulating material 104 overlying a substrate 106 to expose a contact region 108, then filled with conductive material(s) 110 which is patterned to form a contact as shown. Insulating material 104 may actually comprise several layers of different insulating materials such as oxide and/or spin-on glass, and the contact region 108 may be to a source or drain of a field effect transistor, a base, emitter or collector of a junction transistor, or a contact area to some other active region within substrate 106. Substrate 106 in the exemplary embodiment is silicon.

Contact region 108 in the exemplary embodiment is about 0.9–1.0 $\mu$m in diameter. Conductive material(s) 110 in the exemplary embodiment comprises several different layers of various conductive materials including an aluminum-copper alloy, a titanium nitride barrier layer, a titanium layer, and a titanium silicide layer. These layers are formed utilizing the processes described in greater detail below.

Figure 2:
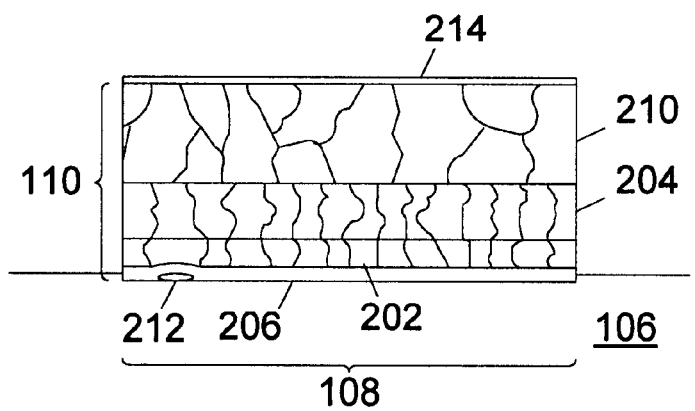
FIG. 2 is a cross-sectional view of conductive layers forming a conventional aluminum contact to a silicon substrate illustrating problems which are overcome by the present invention.

Referring to FIG. 2, a cross-sectional view of conductive layers forming a conventional aluminum contact to a silicon substrate illustrating problems which are overcome by the present invention is illustrated. The view depicted is an enlarged view of the conductive material(s) 110 formed over contact region 108 using conventional techniques. In forming a conductive metal contact 110 to substrate 106, a layer of titanium 202 is formed on the surface of the substrate 106 within the contact region 108, followed by a barrier layer of titanium nitride (TiN) 204. During an anneal of the titanium nitride layer 204, the titanium 202 reacts with the silicon substrate 106 to form a titanium silicide ($TiSi_2$) layer 206. An aluminum-copper (AlCu) alloy layer 210 is then deposited over the titanium nitride barrier layer 204.

Two characteristics of the above described contact structure contribute to diffusion of silicon from the substrate 106 into the aluminum-copper alloy layer 210 of the contact 110 and/or junction spiking by the aluminum-copper alloy layer 210 into the silicon substrate 106. First, residue 212 inadvertently left within the contact area 108 during formation of the contact opening, which may be a thin layer of residue on the entire silicon surface of the contact area 108 rather than an isolated spot 212 as shown, is likely to inhibit formation of titanium silicide 206 between the silicon substrate 106 and the titanium layer 202. Second, aluminum or aluminum-copper molecules from the aluminum-copper layer 210 diffuse along the continuous grain boundaries within the titanium nitride barrier layer 204, which tend to align with similar grain boundaries within the titanium layer 202 as illustrated in FIG. 2.

With reference now to FIGS. 3A through 3D, a series of cross-sectional views of the conductive layers employed in forming an aluminum contact to a silicon substrate in accordance with a preferred embodiment of the present invention are depicted. The views depicted are enlarged views of the conductive material (s) 110 formed over contact region 108 as shown in FIG. 1. The process begins, as shown in FIG. 3A, with cleaning of the contact region 108 to remove any residue which may have remained following formation of the contact opening.

A robust titanium nitride barrier process is important to prevent junction spiking. If the surface condition of the contact region 108 prior to deposition of the titanium nitride barrier is not clean, the integrity of the titanium nitride barrier becomes questionable and aluminum spiking may occur.

Moreover, it is important that the titanium under the titanium nitride barrier layer react with the silicon substrate during the post barrier deposition anneal process to form titanium silicide across the entire contact region 108, allowing good contact with the substrate and reducing the chances of silicon diffusing into the aluminum metal layer. If the contact region 108 is not cleaned, residue may remain on the surface of the substrate 106 within the contact region and, during subsequent processes, the titanium may start reacting initially with the residue, thereby degrading the titanium nitride integrity and prevent a continuous layer of titanium silicide from forming across the contact region 108.

Figure 4A:
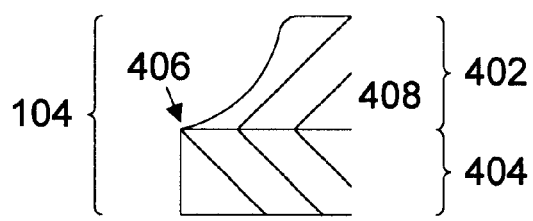
FIGS. 4A–4B are comparative diagrams illustrating the contact opening contour profile at an interface between dielectric materials when contact openings are formed in accordance with the prior art and in accordance with the present invention.
Figure 4B:
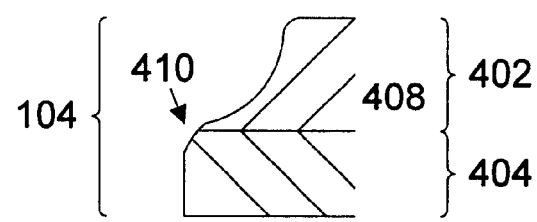

In the present invention, therefore, an Endura soft sputter etch is employed to clean the contact region 108. The RF2/RF1 ratio for a soft sputter etch should be greater than or equal to 1 (e.g., RF2=300 Watts; RF1=150 Watts or RF2=RF1=300 Watts). The total etch amount should be in the range of 60–120 Å, and without damaging the emitter area in a bipolar region containing the contact being cleaned.

Where the insulating material 104 through which the contact opening is formed includes multiple layers of different material, including a borophosphorus silicate glass (BPSG) layer 402 and a tetraethyloxysilane (TEOS) layer 404 as shown in FIGS. 4A and 4B, wet etching about 60 Å or more of the insulating material using an HF etch causes a protrusion 406 or dimpling problem at the BPSG/TEOS interface 408 as shown in FIG. 4A, creating a high stress area for the titanium nitride barrier layer which contributes to cracking of the titanium nitride layer at that point. With the introduction of a soft sputter etch cleaning the contact region 108 prior to formation of the contact, the HF etch may be reduced to approximately 25 Å, providing a smoother contact contour 410 at the BPSG/TEOS interface 408 as shown in FIG. 4B, and eliminating a high stress area problem for titanium nitride barrier integrity.

It should be noted that even if the soft sputter etch is not completely successful in removing all residue from the contact area, use of a two-step titanium nitride barrier layer as described in further detail below will maintain barrier integrity and eliminate junction spiking.

After cleaning, a titanium layer 202 and a titanium nitride layer 204a/204b are formed over the contact region 108 as shown in FIG. 3B. The titanium nitride barrier is deposited in a two step process causing a shift in the grain boundaries between the two titanium nitride layers 204a and 204b as shown. Within this discontinuous columnar grain structure, the grain shifts act as traps for aluminum or aluminum alloy molecules attempting to diffuse through the titanium nitride layers 204a/204b, increasing the difficulty of such diffusion and improving the contact barrier performance.

Titanium nitride layers 204a/204b are each about 500 Å thick and may be formed using any two discrete deposition steps, including deposition processes employing the same parameters (e.g., high power/low pressure or low power/high pressure) for formation of both layers. However, different deposition parameters are preferably utilized to insure grain boundary shifting. For example, titanium nitride layer 204a may be formed at low power and high pressure (6.5 KW, >5 mT) while titanium nitride layer 204b is formed at high power and low pressure (9 KW, <5 mT), or vice versa. Either parameter or both may be altered between the two deposition steps, which should preferably be separated by a time interval.

After formation of titanium nitride layers 204a/204b, a rapid thermal anneal is performed, causing reaction of titanium 202 with the silicon substrate 106 and formation of titanium silicide 206 as shown in FIG. 3C. Because of the soft sputter etch used to clean the contact region 108, residue which migh react with the titanium and form a discontinuity of the titantium silicide layer is not present, and the titanium silicide layer 206 has an even upper surface with no bumps reflecting the presence of residue or titantium reacted with the residue (TiX).

Finally, an aluminum alloy layer 210 is formed over the titanium nitride layers 204a/204b as shown in FIG. 3D to complete the conductive contact 110. A titanium nitride antirelective coating (ARC) layer 214 may be formed over the conductive contact 110.

Junction spiking is eliminated in the present invention with (1) a continuous titanium silicide layer 206 across the contact region 108, (2) no protrusion in the contact contour at the BPSG/TEOS interface to cause stress-induced cracking of the titanium nitride barrier layer(s), and (3) discontinuous grain boundaries within the two-layer titanium nitride barrier. Although the two-step titanium nitride process may be employed without a soft sputter etch, performance of the barrier is improved with cleaning of the contacts using a soft sputter etch.

The exemplary embodiment employs a titanium nitride barrier layer for an aluminum or aluminum alloy contact. However, the same two-step process for providing grain boundary discontinuities may also be employed in tantalum nitride, used as a barrier layer for copper contacts.

While the invention has been particularly shown and described with reference to a preferred embodiment, it will be understood by those skilled in the art that various changes in form and detail may be made therein without departing from the spirit and scope of the invention.

What is claimed is:

1. A method of forming a metal contact to a silicon substrate, comprising:
   forming an insulating material over the silicon substrate, the insulating material having an opening therethrough exposing a contact region;
   forming adjoining barrier layers of a same material over the contact region utilizing at least two discrete deposition steps to provide a grain boundary shift between the barrier layers; and
   forming a metal contact over the barrier layers.

2. The method of claim 1, further comprising:
   soft sputter etching the contact region to remove any residue remaining after formation of the opening through the insulating material;
   forming a refractory metal layer on the silicon substrate over the contact region; and
   causing the refractory metal layer to react with the silicon substrate by using a rapid thermal anneal tool to form a refractory metal silicide over the contact region beneath the refractory metal.

3. The method of claim 2, wherein the step of causing the refractory metal layer to react with the silicon substrate to form a refractory metal silicide over the contact region beneath the refractory metal further comprising:
   forming a continuous silicide over the entire contact region with an even upper surface free of bumps.

4. The method of claim 2, further comprising:
   forming the refractory metal layer of titanium, the barrier layers of titanium nitride, and the metal contact of aluminum or aluminum alloy with a titanium nitride antireflective coating layer.

5. The method of claim 2, further comprising:
   forming the refractory metal layer of tantalum, the barrier layers of tantalum nitride, and the metal contact of copper.

6. A method of forming a metal contact to a silicon substrate, comprising:
   forming an insulating material over the silicon substrate, the insulating material having an opening therethrough exposing a contact region;
   forming barrier layers over the contact region utilizing at least two discrete deposition steps to provide a grain boundary shift between the barrier layers by one of the following:
      forming a first barrier layer using a low power, high pressure deposition and forming a second barrier layer over the first barrier layer using a high power, low pressure deposition; and
      forming the first barrier layer using a high power, low pressure deposition and forming the second barrier layer over the first barrier layer using a low power, high pressure deposition; and
   forming a metal contact over the barrier layers.

7. A method of forming a metal contact to a silicon substrate, comprising:
   forming an insulating material over the silicon substrate, the insulating material having an opening therethrough exposing a contact region;
   forming barrier layers over the contact region utilizing at least two discrete deposition steps to provide a grain boundary shift between the barrier layers by one of the following:
      depositing a first barrier layer using a first power and a first pressure and depositing a second barrier layer using the first power and the first pressure;
      depositing the first barrier layer using the first power and the first pressure and depositing the second barrier layer using the first power and a second pressure different from the first pressure;
      depositing the first barrier layer using the first power and the first pressure and depositing the second barrier layer using a second power different from the first power and the first pressure; and
      depositing the first barrier layer using the first power and the first pressure and depositing the second barrier layer using the second power and the second pressure,
   wherein deposition is stopped after forming the first barrier layer and restarted after an interval of time to form the second barrier layer; and
   forming a metal contact over the barrier layers.

8. A metal contact to a silicon substrate, comprising:
   an insulating material over the silicon substrate, the insulating material having an opening therethrough exposing a contact region;
   adjoining barrier layers formed of a same material over the contact region and having a grain boundary shift between the barrier layers; and
   a metal contact over the barrier layers.

9. The metal contact of claim 8, further comprising:
   a refractory metal layer on the silicon substrate over the contact region; and
   a refractory metal silicide over the contact region beneath the refractory metal.

10. The metal contact of claim 9, wherein the refractory metal silicide further comprises:
    a continuous silicide over the entire contact region with an even upper surface free of bumps.

11. The metal contact of claim 9, wherein the refractory metal layer is titanium, the barrier layers are titanium nitride, and the metal contact is aluminum or aluminum alloy with a titanium nitride antireflective coating on top of the aluminum alloy.

12. The metal contact of claim 9, wherein the refractory metal layer is tantalum, the barrier layers are tantalum nitride, and the metal contact is copper.

13. The metal contact of claim 8, wherein the barrier layers further comprise:
    more than two barriers layers forming a stack with a grain boundary shift at each interface between two adjoining layers within the stack such that a set of grain boundaries on one side of each interface are discontinuous with a set of grain boundaries on an opposite side of the respective interface.

14. A metal contact to a silicon substrate, comprising:
    an insulating material over the silicon substrate, the insulating material having an opening therethrough exposing a contact region;
    barrier layers over the contact region having a grain boundary shift between the barrier layers and including
       a first barrier layer having a first set of grain boundaries; and
       a second barrier layer having a second set of grain boundaries discontinuous from the first set of grain boundaries; and
    a metal contact over the barrier layers.

15. A metal contact to a silicon substrate, comprising:

an insulating material over the silicon substrate, the insulating material having an opening therethrough exposing a contact region; and first and second titanium nitride barrier layers formed adjacent to each other but having discontinuous grain boundaries at an interface between the first and second titanium nitride barrier layers.

16. A method of forming an aluminum metal contact to a silicon substrate, comprising:

forming an insulating material stack over the silicon substrate, the insulating material stack having an opening therethrough exposing a contact region;

forming a first titanium nitride barrier layer over the contact region utilizing a first deposition process;

forming a second titanium nitride barrier layer on the first titanium nitride barrier layer utilizing a second deposition process discrete from the first deposition process to produce discontinuity of grain boundaries within the first and second titanium nitride barrier layers at an interface between the first and second titanium nitride barrier layers; and forming an aluminum or aluminum alloy metal contact over the first and second barrier layers.

17. The method of claim 16, further comprising:

soft sputter etching the contact region to remove any residue remaining after formation of the opening through the insulating material stack and to reduce a protrusion of a contact profile for the opening at an interface between first and second dielectrics forming the insulating material stack;

forming a titanium layer on the silicon substrate over the contact region; and after forming the first and second titanium nitride barrier layers, annealing the first and second titanium nitride barrier layers at a temperature causing the titanium layer to react with the silicon substrate to form a continuous titanium silicide over the entire contact region beneath the titanium metal, wherein the titanium silicide has an even upper surface free of bumps.

18. The method of claim 16, further comprising one of the following:

forming the first titanium nitride barrier layer using a low power, high pressure deposition and forming the second titanium nitride barrier layer using a high power, low pressure deposition; and forming the first titanium nitride barrier layer using a high power, low pressure deposition and forming the second titanium nitride barrier layer using a low power, high pressure deposition.

19. The method of claim 16, further comprising:

forming the first titanium nitride barrier layer and the second titanium nitride barrier layer using two depositions separated by an interval of time and employing one of the following:

a same power and a same pressure for both depositions;

a same power and different pressures for the two depositions;

different powers and a same pressure for the two depositions; and different powers and different pressures for the two depositions.

20. The method of claim 16, further comprising:

forming the first and second titanium nitride barrier layers with a shift in grain boundaries therein between the first and second titanium nitride barrier layers.

* * * * *